United States Patent
Meng et al.

(10) Patent No.: US 8,018,416 B2
(45) Date of Patent: Sep. 13, 2011

(54) DRIVING CIRCUIT WITH OUTPUT CONTROL CIRCUIT AND LIQUID CRYSTAL DISPLAY USING SAME

(75) Inventors: Kai Meng, Shenzhen (CN); Xiao-Jing Qi, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 985 days.

(21) Appl. No.: 11/903,769

(22) Filed: Sep. 24, 2007

(65) Prior Publication Data
US 2008/0074168 A1 Mar. 27, 2008

(30) Foreign Application Priority Data
Sep. 22, 2006 (TW) .............................. 95135186 A

(51) Int. Cl.
*G09G 3/36* (2006.01)
(52) U.S. Cl. .............. 345/98; 345/87; 345/92; 345/100; 345/204
(58) Field of Classification Search ............ 345/87–100, 345/204, 211–213, 690
See application file for complete search history.

(56) References Cited

U.S. PATENT DOCUMENTS

| | | | |
|---|---|---|---|
| 7,199,777 B2 | 4/2007 | Moon | |
| 7,212,196 B2* | 5/2007 | Nakamura et al. | 345/213 |
| 7,486,261 B2* | 2/2009 | Oh et al. | 345/76 |
| 2002/0036606 A1* | 3/2002 | Ichikawa et al. | 345/87 |
| 2005/0174344 A1 | 8/2005 | La | |
| 2006/0071890 A1 | 4/2006 | Kikuchi | |

FOREIGN PATENT DOCUMENTS

| | | |
|---|---|---|
| CN | 1620628 A | 5/2005 |
| JP | 4-368992 A | 12/1992 |
| TW | 200417979 A | 9/2004 |
| TW | 200535751 A | 11/2005 |

* cited by examiner

*Primary Examiner* — Quan-Zhen Wang
*Assistant Examiner* — Jennifer T Nguyen
(74) *Attorney, Agent, or Firm* — Altis Law Group, Inc.

(57) ABSTRACT

An exemplary driving circuit (20) includes gate lines (201) that are parallel to each other and that each extend along a first direction; first data lines (202) that are parallel to each other and that each extend along a second direction substantially orthogonal to the first direction; thin film transistors (203) provided in the vicinity of intersections of the gate lines and the data lines; a gate driving circuit (210) connected to the gate lines; a data driving circuit (220) connected to the data lines; an access circuit (230) configured for accessing data signals outputted by the data driving circuit; and an output control circuit (240) configured for receiving the data signals accessed by the access circuit and making the time period in which the data signals are applied to the first data lines in accord with the time period during which the thin film transistors are switched on.

20 Claims, 5 Drawing Sheets

US 8,018,416 B2

DRIVING CIRCUIT WITH OUTPUT CONTROL CIRCUIT AND LIQUID CRYSTAL DISPLAY USING SAME

FIELD OF THE INVENTION

The present invention relates a driving circuit and a liquid crystal display (LCD) using the driving circuit, and particularly to a driving circuit including an access circuit and an output control circuit for controlling the timing of data signals.

GENERAL BACKGROUND

An LCD has the advantages of portability, low power consumption, and low radiation, and has been widely used in various portable information products such as notebooks, personal digital assistants (PDAs), video cameras and the like. Furthermore, the LCD is considered by many to have the potential to completely replace CRT (cathode ray tube) monitors and televisions. An LCD generally includes a liquid crystal panel, a driving circuit for driving the liquid crystal panel, and a backlight module for illuminating the liquid crystal panel.

FIG. 5 is essentially an abbreviated circuit diagram of a typical driving circuit 10 of an LCD. The driving circuit 10 includes a number n (where n is a natural number) of gate lines 101 that are parallel to each other and that each extend along a first direction, a number m (where m is also a natural number) of data lines 102 that are parallel to each other and that each extend along a second direction orthogonal to the first direction, a plurality of thin film transistors (TFTs) 103 that function as switching elements, a plurality of pixel electrodes 104, a gate driving circuit 110, and a data driving circuit 120. The crossed gate lines 101 and data lines 102 define an array of pixel units of the LCD. Each TFT 103 is provided in the vicinity of a respective point of intersection of the gate lines 101 and the data lines 102. The gate driving circuit 110 is used to drive the gate lines 101. The data driving circuit 120 is used to drive the data lines 102.

FIG. 6 is an equivalent circuit diagram relating to the driving circuit 10 at one of the pixel units. A gate electrode 1031, a source electrode 1032, and a drain electrode 1033 of the TFT 103 are connected to a corresponding gate line 101, a corresponding data line 102, and a corresponding pixel electrode 104 respectively. Cgd is a parasitic capacitor formed between the gate electrode 1031 and the drain electrode 1033 of the TFT 103.

The gate line 101 has an essential resistance R, which associated with the parasitic capacitor Cgd forms an RC (resistance-capacitance) delay circuit. The RC delay circuit distorts a scanning signal applied to the gate line 101. A distortion of the scanning signal is determined by the essential resistance R and a capacitance of the parasitic capacitor Cgd.

Referring also to FIG. 7, this is a waveform diagram showing distortion of a scanning signal applied to any one of the gate lines 101. $V_{on}$ represents a gate-on voltage of the TFT 103. $V_{off}$ represents a gate-off voltage of the TFT 103. $V_{g1}$ shows a waveform of the scanning signal when the scanning signal is adjacent the gate driving circuit 110. $V_{g2}$ shows a waveform of the scanning signal when the scanning signal is far from the gate driving circuit 110. As seen, $V_{g2}$ is distorted, such that the switching on time of the corresponding TFT 103 is delayed for a period of "t" seconds.

Because the switching on time of the TFTs 103 far from the gate driving circuit 110 is delayed, these TFTs 103 are turned off when they should be turned on. At the same time, the data driving circuit 120 outputs data signals on time; thus the data signals are applied to the source electrodes 1032 of the TFTs 103 in a very short time. As a result, insufficient charging of the pixel units far from the gate driving circuit 110 and electrical leakage may occur. This in turn impairs the display quality of the LCD. For example, flickering of displayed images may occur.

What is needed, therefore, is a new driving circuit of an LCD that can overcome the above-described deficiencies. What is also needed is an LCD using such a driving circuit.

SUMMARY

In one preferred embodiment, a driving circuit includes: a plurality of gate lines that are parallel to each other and that each extend along a first direction; a plurality of first data lines that are parallel to each other and that each extend along a second direction substantially orthogonal to the first direction; a plurality of thin film transistors respectively provided in the vicinity of intersections of the gate lines and the data lines; a gate driving circuit connected to the gate lines; a data driving circuit connected to the data lines; an access circuit configured for accessing data signals outputted by the data driving circuit; and an output control circuit configured for receiving the data signals accessed by the access circuit and making the time period in which the data signals are applied to the first data lines accord with the time period during which the thin film transistors are switched on.

Other novel features and advantages will become more apparent from the following detailed description when taken in conjunction with the accompanying drawings. In the drawings, all the views are schematic.

DETAILED DESCRIPTION OF PREFERRED EMBODIMENTS

Figure 1:
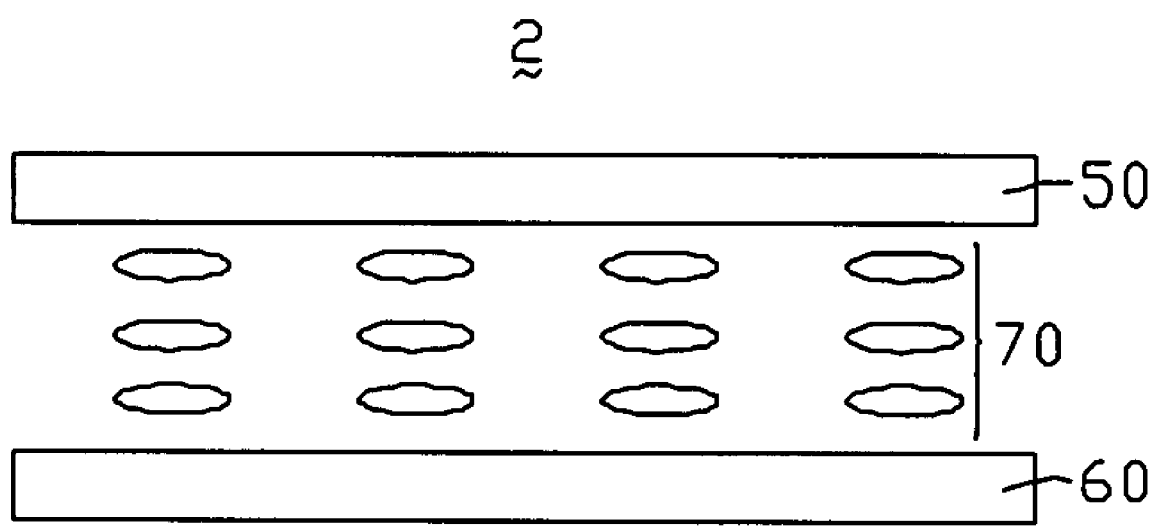
FIG. 1 is side, cross-sectional view of an LCD according to an exemplary embodiment of the present invention, the LCD including a driving circuit (not shown).

Referring to FIG. 1, an LCD according to an exemplary embodiment of the present invention is shown. The LCD 2 includes a first substrate 50, a second substrate 60, a liquid crystal layer 70 sandwiched between the first substrate 50 and the second substrate 60, and a driving circuit (now shown).

Figure 2:
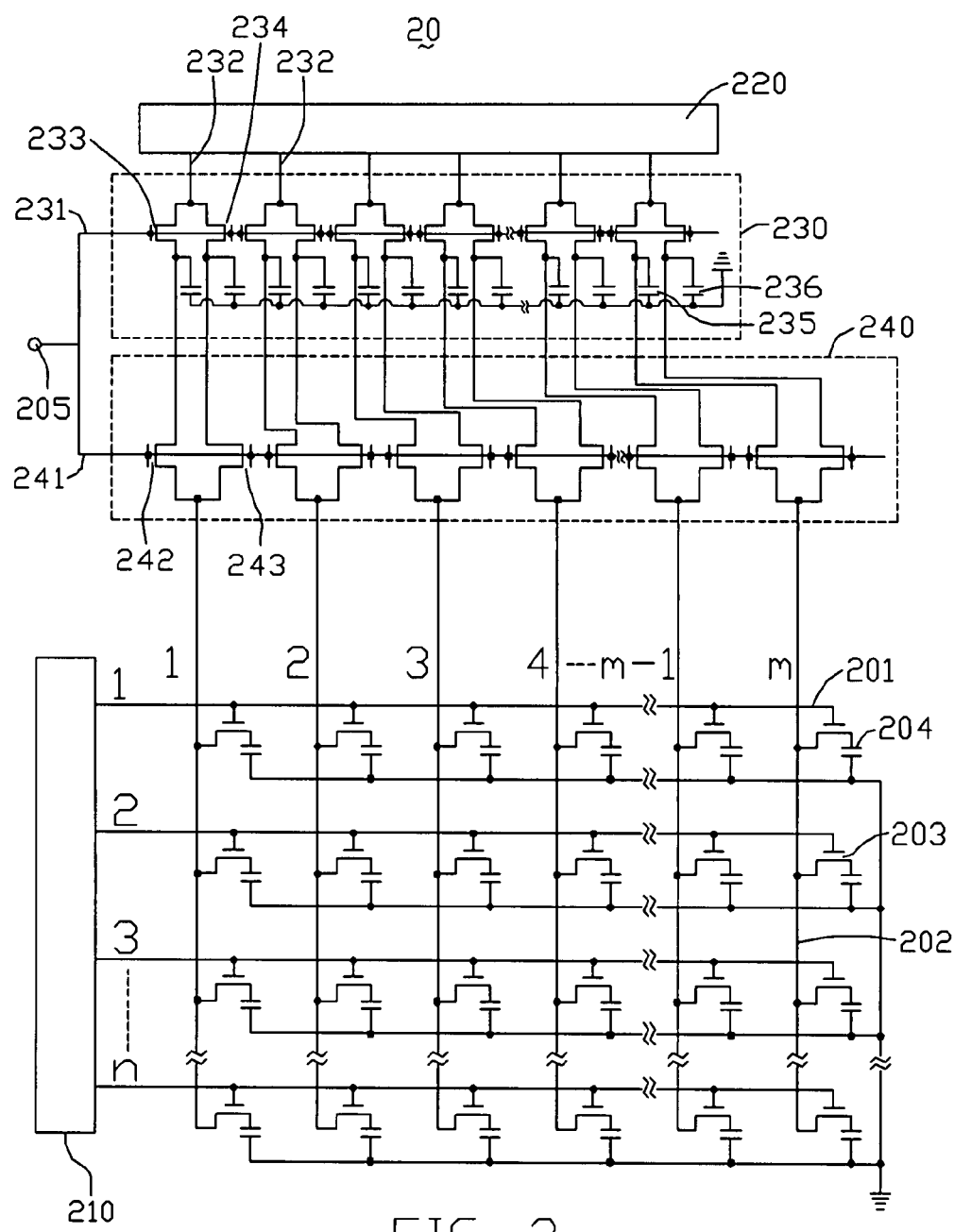
FIG. 2 is essentially an abbreviated circuit diagram of the driving circuit of the LCD of the exemplary embodiment.

Referring to FIG. 2, the driving circuit 20 includes a number n (where n is a natural number) of gate lines 201 that are parallel to each other and that each extend along a first direction, a number m (where m is also a natural number) of first data lines 202 that are parallel to each other and that each extend along a second direction orthogonal to the first direction, a plurality of thin film transistors (TFTs) 203 that function as switching elements, a plurality of pixel electrodes 204, a gate driving circuit 210, a data driving circuit 220, an access circuit 230, an output control circuit 240, and a signal input terminal 205. Each TFT 203 is provided in the vicinity of a respective point of intersection of the gate lines 201 and the first data lines 202. A gate electrode, a source electrode, and a drain electrode of each TFT 203 are connected to a corresponding gate line 201, a corresponding first data line 202, and a corresponding pixel electrode 204 respectively.

The gate driving circuit 210 is used to generate a plurality of scanning signals and apply the scanning signals to the gate lines 201. The data driving circuit 220 is used to generate a plurality of data signals and apply the data signals to the first data lines 202 when the scanning signals are applied to the gate lines 201. The signal input terminal 205 is used to receive input signals and provide the signals to the access circuit 230 and the output control circuit 240. The access circuit 230 is disposed in the data driving circuit 220 or adjacent to the data driving circuit 220, and is used to access the data signals outputted from the data driving circuit 220. The output control circuit 240 is used to control the time period in which the data signals accessed by the access circuit 230 are applied to the first data lines 202.

The access circuit 230 includes a first signal line 231, a plurality of second data lines 232, a plurality of first field-effect transistors 233, a plurality of second field-effect transistors 234, a plurality of first capacitors 235, and a plurality of second capacitors 236. The first signal line 231 is connected to the signal input terminal 205.

The first field-effect transistors 233 are n-channel enhancement mode metal-oxide-semiconductor field-effect transistors (N-MOSFETs). Each first field-effect transistor 233 includes a gate electrode connected to the first signal line 231, a source electrode connected to a corresponding second data line 232, and a drain electrode connected to ground via a corresponding first capacitor 235.

The second field-effect transistors 234 are p-channel enhancement mode metal-oxide-semiconductor field-effect transistors (P-MOSFETs). Each second field-effect transistor 234 includes a gate electrode connected to the first signal line 231, a source electrode connected to a corresponding second data line 232, and a drain electrode connected to ground via a corresponding second capacitor 236.

The first and second field-effect transistors 233, 234 of the access circuit 230 each have a small size, therefore parasitic capacitors formed in the first and second field-effect transistors 233, 234 are very small. Furthermore, an essential resistance of the first signal line 231 can be reduced by selecting an appropriate material and an appropriate width for the first signal line 231. Therefore the first signal line 231 and the first and second field-effect transistors 233, 234 essentially do not form an RC delay circuit, such that signals applied to the first signal line 231 are not delayed.

The output control circuit 240 includes a second signal line 241, a plurality of third field-effect transistors 242, and a plurality of fourth field-effect transistors 243. The second signal line 241 is connected to the signal input terminal 205.

The third field-effect transistors 242 are N-MOSFETs. Each third field-effect transistor 242 includes a gate electrode connected to the second signal line 241, a source electrode connected to the drain electrode of a corresponding first field-effect transistor 233, and a drain electrode connected to a corresponding first data line 202.

The fourth field-effect transistors 243 are P-MOSFETs. Each fourth field-effect transistor 243 includes a gate electrode connected to the second signal line 241, a source electrode connected to the drain electrode of a corresponding second field-effect transistor 234, and a drain electrode connected to a corresponding first data line 202.

The third and fourth field-effect transistors 242, 243 each have a large size, therefore parasitic capacitors formed in the third and fourth field-effect transistors 242, 243 are large. Furthermore, the second signal line 241 has a great length, therefore the second signal line 241 has a large essential resistance. Thus, the second signal line 241 and the third and fourth field-effect transistors 242, 243 form an RC delay circuit. By selecting an appropriate length and an appropriate material for the second signal line 241 and appropriate sizes of the third and fourth field-effect transistors 242, 243, a delay time of signals applied to the second signal line 241 can be configured to be substantially equal to a delay time of scanning signals applied to the gate lines 201.

Figure 3:
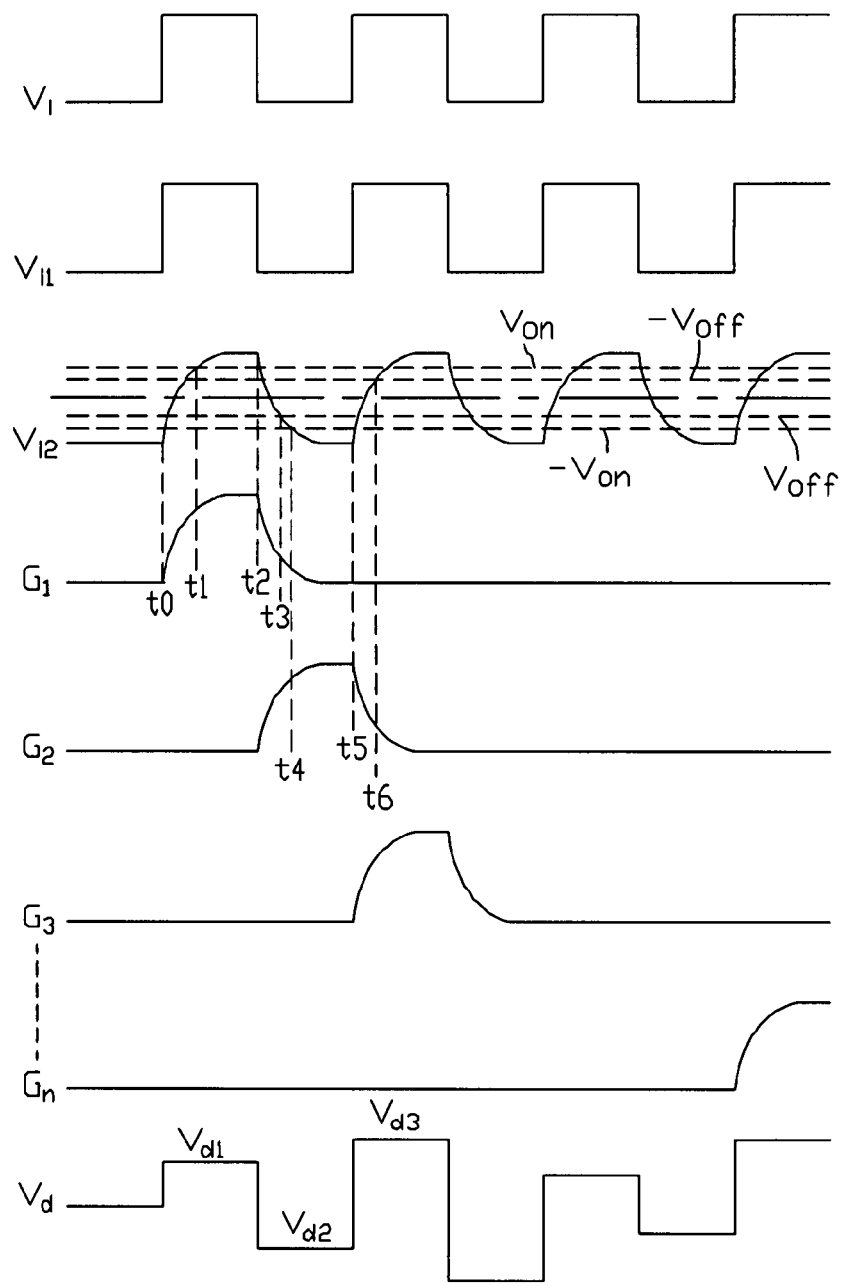
FIG. 3 is a waveform diagram of driving signals of the driving circuit of FIG. 2.

Referring FIG. 3, this is a waveform diagram of driving signals of the driving circuit 20. $V_i$ shows a waveform of signals of the signal input terminal 205. $V_{i1}$ shows a waveform of signals of the first signal line 231. $V_{i2}$ shows a waveform of signals received by the gate electrodes of the third and fourth field-effect transistors 242, 243. $G_1$-$G_n$ show waveforms of scanning signals. $V_d$ shows a waveform of data signals generated by the data driving circuit 220. $V_{on}$ represents a gate-on voltage of each of the third field-effect transistors 242 and the corresponding TFTs 203. $V_{off}$ represents a gate-off voltage of each of the third field-effect transistors 242 and the corresponding TFTs 203. $-V_{on}$ represents a gate-on voltage of each of the fourth field-effect transistors 243. $-V_{off}$ represents a gate-off voltage of each of the fourth field-effect transistors 243. A driving method of the driving circuit 20 is as follows:

During the period t0-t1, the first field-effect transistors 233 are turned on, the second and fourth field-effect transistors 234, 243 are turned off, the third field-effect transistors 242 are turned off because signals applied to the second signal line 241 are delayed, and the TFTs 203 in a first row are turned off because scanning signals applied to the gate lines 201 are delayed. Data signals $V_{d1}$ are provided to the first capacitors 235 via the source electrodes and the drain electrodes of the first field-effect transistors 233.

During the period t1-t2, the first field-effect transistors 233 are still turned on, the third field-effect transistors 242 and the TFTs 203 in the first row are turned on, and the second and fourth field-effect transistors 234, 243 are still turned off. The data signals $V_{d1}$ are provided to the first capacitors 235 via the source electrodes and the drain electrodes of the first field-effect transistors 233, and are also provided to the pixel electrodes 204 via the source electrodes and the drain electrodes of the third field-effect transistors 242 and the source electrodes and the drain electrodes of the TFTs 203 in the first row.

During the period t2-t3, the first field-effect transistors 233 are turned off, the second field-effect transistors 234 are turned on, the third field-effect transistors 242 are still turned on because the signals applied to the second signal line 241 are delayed, the TFTs 203 in the first row are still turned on because the scanning signals applied to the gate lines 201 are delayed, and the fourth field-effect transistors 243 are still turned off because the signals applied to the second signal line 241 are delayed. The first capacitors 235 provide the data signals $V_{d1}$ to the pixel electrodes 204 via the source electrodes and the drain electrodes of the third field-effect transistors 242 and the source electrodes and the drain electrodes of the TFTs 203 in the first row, respectively. At the same time, data signals $V_{d2}$ are provided to the second capacitors 236 via the source electrodes and the drain electrodes of the second field-effect transistors 234.

During the period t3-t4, the first field-effect transistors 233 are still turned off, the second field-effect transistors 234 are still turned on, the third field-effect transistors 242 are turned off, the TFTs 203 in a second row are turned off because the scanning signals applied to the gate lines 201 are delayed, and the fourth field-effect transistors 243 are still turned off because the signals applied to the second signal line 241 are delayed. The data signals $V_{d2}$ are provided to the second capacitors 236 via the source electrodes and the drain electrodes of the second field-effect transistors 234.

During the period t4-t5, the first and third field-effect transistors 233, 242 are still turned off, the second field-effect transistors 234 are still turned on, and the fourth field-effect transistors 243 and the TFTs 203 in the second row are turned on. The data signals $V_{d2}$ are still provided to the second capacitors 236 via the source electrodes and the drain electrodes of the second field-effect transistors 234, and are also provided to the pixel electrodes 204 via the source electrodes and the drain electrodes of the fourth field-effect transistors 243 and the source electrodes and the drain electrodes of the TFTs 203 in the second row.

During the period t5-t6, the first field-effect transistors 233 are turned on, the second field-effect transistors 234 are turned off, the third field-effect transistors 242 are still turned off because the signals applied to the second signal line 241 are delayed, the fourth field-effect transistors 243 are still turned on because the signals applied to the second signal line 241 are delayed, and the TFTs 203 in the second row are still turned on because the scanning signals applied to the gate lines 201 are delayed. The second capacitors 236 provide the data signals $V_{d2}$ to the pixel electrodes 204 via the source electrodes and the drain electrodes of the fourth field-effect transistors 243 and the source electrodes and the drain electrodes of the TFTs 203 in the second row, respectively. At the same time, data signals $V_{d3}$ are provided to the first capacitors 235 via the source electrodes and the drain electrodes of the first field-effect transistors 233.

In summary, the access circuit 230 can access the data signals, and the output control circuit 240 can receive the data signals accessed by the access circuit 230 and make the time period in which the data signals are applied to the first data lines 202 accord with the switching on time period during which the TFTs 203 are switched on. Therefore, although the switching on time period during which the TFTs 203 are switched on is delayed, the time period in which the data signals are applied to the TFTs 203 is not reduced. Thus, flickering of images displayed by the LCD 2 can be avoided, and therefore the display quality of the LCD 2 is improved.

Figure 4:
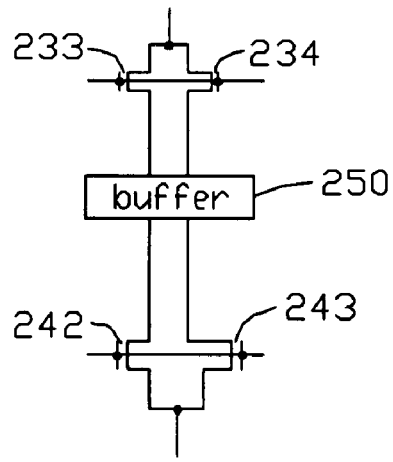
FIG. 4 is essentially a circuit diagram of part of a driving circuit according to an alternative embodiment of the present invention.
Figure 5:
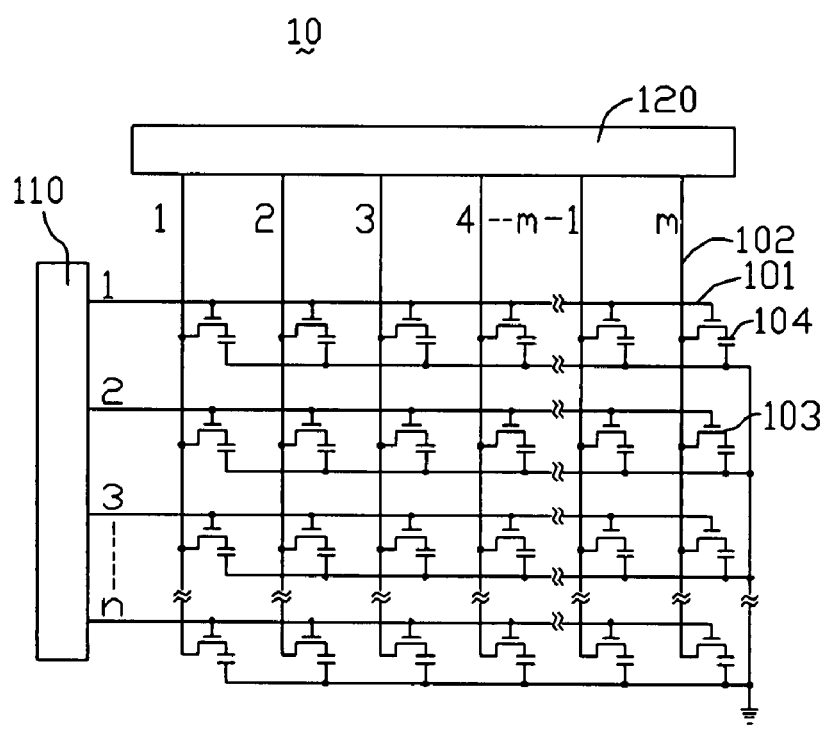
FIG. 5 is essentially an abbreviated circuit diagram of a conventional driving circuit of an LCD, the driving circuit including a plurality of scanning lines and a plurality of data lines that cooperate with the gate lines to define a plurality of pixel units.
Figure 6:
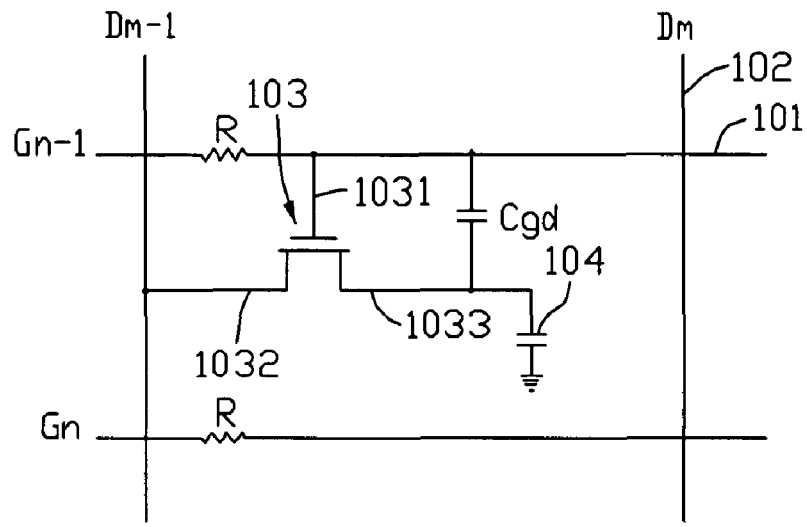
FIG. 6 is an equivalent circuit diagram of one of the pixel units of FIG. 5.
Figure 7:
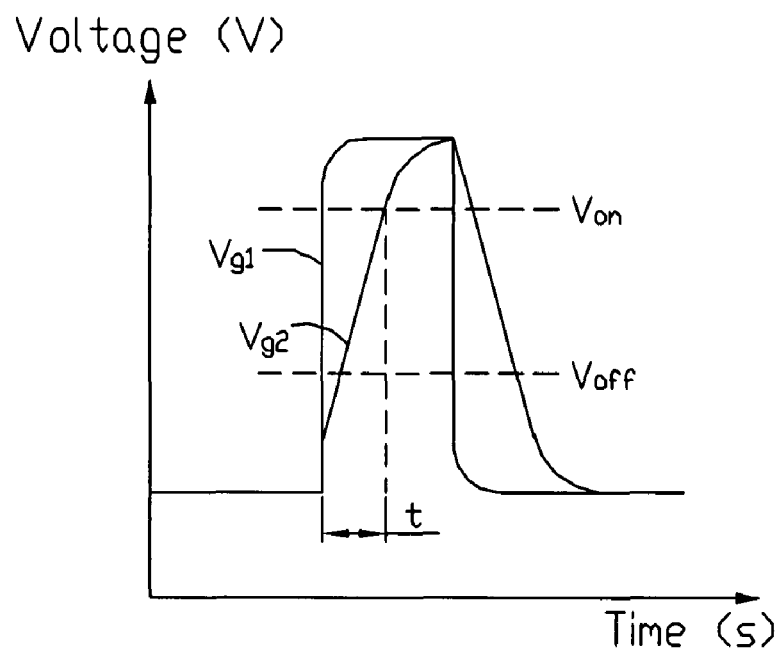
FIG. 7 is a waveform diagram showing, inter alia, distortion of a scanning signal applied to one of the gate lines of the driving circuit of FIG. 5.

Further or alternative embodiments may include the following. Referring to FIG. 4, in one example, the driving circuit 20 further includes a plurality of buffers 250. Each buffer 250 is connected between the drain electrode of a corresponding first field-effect transistor 233 and the source electrode of the corresponding third field-effect transistor 242, and between the drain electrode of the corresponding second field-effect transistor 234 and the source electrode of the corresponding fourth field-effect transistor 243. In another example, the first and third field-effect transistors 233, 242 can be n-channel depletion mode metal-oxide-semiconductor field-effect transistors, and the second and fourth field-effect transistors 234, 243 can be p-channel depletion mode metal-oxide-semiconductor field-effect transistors.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A driving circuit comprising:
a plurality of gate lines that are parallel to each other and that each extend along a first direction;
a plurality of first data lines that are parallel to each other and that each extend along a second direction substantially orthogonal to the first direction;
a plurality of thin film transistors respectively provided in the vicinity of intersections of the gate lines and the first data lines;
a gate driving circuit connected to the gate lines;
a data driving circuit connected to the first data lines;
a signal input terminal;
an access circuit configured for accessing data signals outputted by the data driving circuit, the access circuit comprising a first signal line connected to the signal input terminal, a plurality of second data lines, a plurality of first field-effect transistors, a plurality of second field-effect transistors, a plurality of first capacitors, and a plurality of second capacitors, each first field-effect transistor comprising a gate electrode connected to the first signal line, a source electrode connected to a corresponding second data line, and a drain electrode connected to ground via a corresponding first capacitor, and each second field-effect transistor comprising a gate electrode connected to the first signal line, a source electrode connected to a corresponding second data line, and a drain electrode connected to ground via a corresponding second capacitor; and
an output control circuit configured for receiving the data signals accessed by the access circuit and making the time period in which the data signals are applied to the first data lines accord with the time period during which the thin film transistors are switched on.

2. The driving circuit as claimed in claim 1, wherein the access circuit is provided in the data driving circuit or adjacent to the data driving circuit.

3. The driving circuit as claimed in claim 1, wherein the signal input terminal is configured for receiving input signals, the signals comprises a plurality of first control portions and a plurality of second control portions inverted with the first control portions, the first and second control portions are alternately outputted by the signal input terminal, wherein for any one of scanning signals output by the gate driving circuit in order to activate the gate lines, the starting time when the scanning signal is to be applied to the gate line connected with the thin film transistors to which the data signals should be applied is synchronous with the starting time when a corresponding control portion from the first and second control portions of the signals is applied to the first signal line.

4. The driving circuit as claimed in claim 3, wherein the output control circuit comprises a second signal line connected to the signal input terminal, a plurality of third field-effect transistors, and a plurality of fourth field-effect transistors, each third field-effect transistor comprising a gate electrode connected to the second signal line, a source electrode connected to the drain electrode of a corresponding first field-effect transistor, and a drain electrode connected to a corresponding first data line, and each fourth field-effect transistor comprising a gate electrode connected to the second signal line, a source electrode connected to the drain electrode of a corresponding second field-effect transistor, and a drain electrode connected to a corresponding first data line.

5. The driving circuit as claimed in claim 4, wherein according to the thin film transistors, the third and four field-effect transistors which connect with any one of the first data lines, the time when the third and four field-effect transistors are switched on by the corresponding control portions transmitted via the second signal line is synchronous with the time when a thin film transistor is switched on by the scanning signal transmitted via the gate line.

6. The driving circuit as claimed in claim 5, wherein the first and third field-effect transistors are n-channel enhancement mode metal-oxide-semiconductor field-effect transistors, and the second and fourth field-effect transistors are p-channel enhancement mode metal-oxide-semiconductor field-effect transistors, each first control portion of the signals from the signal input terminal being configured to switch on one kind of the n-channel and p-channel enhancement mode metal-oxide-semiconductor field-effect transistors and switch off the other kind, each second control portion of the signals from the signal input terminal being configured to switch off said one kind of the n-channel and p-channel enhancement mode metal-oxide-semiconductor field-effect transistors and switch on the other kind.

7. The driving circuit as claimed in claim 4, further comprising a plurality of buffers, each buffer being connected between the drain electrode of a corresponding first field-effect transistor and the source electrode of the corresponding third field-effect transistor, and being further connected between the drain electrode of a corresponding second field-effect transistor and the source electrode of the corresponding fourth field-effect transistor.

8. The driving circuit as claimed in claim 4, wherein the first and third field-effect transistors are n-channel depletion mode metal-oxide-semiconductor field-effect transistors, and the second and fourth field-effect transistors are p-channel depletion mode metal-oxide-semiconductor field-effect transistors, each first control portion of the signals from the signal input terminal being configured to switch on one kind of the n-channel and p-channel depletion mode metal-oxide-semiconductor field-effect transistors to be switched on and switch off the other kind, each second control portion of the signals from the signal input terminal being configured to switch off said one kind of the n-channel and p-channel enhancement mode metal-oxide-semiconductor field-effect transistors and switch of the other kind.

9. The driving circuit as claimed in claim 3, wherein all of the first field-effect transistors or all of the second field-effect transistors are enabled by the corresponding control portions with substantially no delay time.

10. A liquid crystal display (LCD) comprising:
a first substrate;
a second substrate;
a liquid crystal layer sandwiched between the first and second substrates; and
a driving circuit comprising:
a plurality of gate lines that are parallel to each other and that each extend along a first direction;
a plurality of first data lines that are parallel to each other and that each extend along a second direction substantially orthogonal to the first direction;
a plurality of thin film transistors respectively provided in the vicinity of intersections of the gate lines and the first data lines;
a gate driving circuit connected to the gate lines and configured for generating scanning signals to corresponding gate lines;
a data driving circuit configured for generating data signals;
an access circuit connected to the data driving circuit, the access circuit being configured for accessing the data signals outputted by the data driving circuit, being charged by the data signals from the data driving circuit during a first predetermined time periods, and discharging during a second predetermined time periods for providing discharge signals; and
an output control circuit connected to the access circuit, the output control circuit being configured for receiving the data signals and the discharge signals from the access circuit, outputting the data signals and the discharge signals to the corresponding first data lines;
wherein, for each of the first data lines, the time period in which the data signals and the discharge signals are applied accord with the time period during which the thin film transistors to which the data signals should be applied are switched on.

11. The LCD as claimed in claim 10, wherein the access circuit is provided in the data driving circuit or adjacent to the data driving circuit.

12. The LCD as claimed in claim 10, wherein the driving circuit further comprises a signal input terminal, the access circuit comprising a first signal line connected to the signal input terminal, a plurality of second data lines, a plurality of first field-effect transistors, a plurality of second field-effect transistors, a plurality of first capacitors, and a plurality of second capacitors, each first field-effect transistor comprising a gate electrode connected to the first signal line, a source electrode connected to a corresponding second data line, and a drain electrode connected to ground via a corresponding first capacitor, and each second field-effect transistor comprising a gate electrode connected to the first signal line, a source electrode connected to a corresponding second data line, and a drain electrode connected to ground via a corresponding second capacitor.

13. The LCD as claimed in claim 12, wherein the signal input terminal is configured for receiving input signals, the signals comprises a plurality of first control portions and a plurality of second control portions inverted with the first control portions, the first and second control portions are alternately outputted by the signal input terminal, wherein for any one of scanning signals output by the gate driving circuit in order to activate the gate lines, the starting time when the scanning signal is to be applied to the gate line connected with the thin film transistors to which the data signals should be applied is synchronous with the starting time when a corresponding control portion from the first and second control portions of the signals is applied to the first signal line.

14. The LCD as claimed in claim 13, wherein the output control circuit comprises a second signal line connected to the signal input terminal, a plurality of third field-effect transistors, and a plurality of fourth field-effect transistors, each third field-effect transistor comprising a gate electrode connected to the second signal line, a source electrode connected to the drain electrode of a corresponding first field-effect transistor, and a drain electrode connected to a corresponding first data line, and each fourth field-effect transistor comprising a gate electrode connected to the second signal line, a source electrode connected to the drain electrode of a corresponding second field-effect transistor, and a drain electrode connected to a corresponding first data line.

15. The LCD as claimed in claim 14, wherein according to the thin film transistors, the third and four field-effect transistors which connect with any one of the first data lines, the time when the third and four field-effect transistors are switched on by the corresponding control portions transmitted via the second signal line is synchronous with the time when a thin film transistor is switched on by the scanning signal transmitted via the gate line.

16. The LCD as claimed in claim 14, wherein the driving circuit further comprises a plurality of buffers, each buffer being connected between the drain electrode of a corresponding first field-effect transistor and the source electrode of the corresponding third field-effect transistor, and being further connected between the drain electrode of a corresponding second field-effect transistor and the source electrode of the corresponding fourth field-effect transistor.

17. The LCD as claimed in claim 14, wherein the second signal line and the gate lines are produced by same processes so as to have substantially same characteristics.

18. The LCD as claimed in claim 13, wherein all of the first field-effect transistors or all of the second field-effect transistors are enabled by the corresponding control portions with substantially no delay time.

19. A driving circuit comprising:
   a plurality of gate lines;
   a plurality of first data lines;
   a plurality of first thin film transistors connecting with the gate lines and the first data lines;
   a gate driving circuit for providing scanning signals to the plurality of gate lines;
   a data driving circuit for providing data signals; and
   a control circuit configured for accessing data signals outputted by the data driving circuit, storing the data signals, and outputting both the data signals directly from the data driving circuit and the data signals stored in the control circuit to the plurality of first data lines;
   wherein, during a first time period from the time when the data signals are accessed by the control circuit to the time when corresponding first thin film transistors to which the data signals should be applied are switched on, the control circuit stores the data signals and not output the data signals to corresponding first data lines, during a second time period from the time when the corresponding first thin film transistors are switched on to the time when the data signals are completely accessed by the control circuit, the control circuit outputs the data signals directly from the data driving circuit to the corresponding first data lines, and during a third time period from the time when the data signals are completely accessed by the control circuit to the time when the corresponding first thin film transistors are switched off, the control circuit outputs the stored data signals to corresponding first data lines.

20. The driving circuit as claimed in claim 19, wherein the control circuit comprises an access circuit and an output control circuit, the access circuit connects to the data driving circuit, and is configured for accessing and storing the data signals outputted by the data driving circuit, the output control circuit connects to the accessing circuit, and is configured for controlling whether the data signals are output to the corresponding first data lines.

* * * * *